United States Patent
Heinrich et al.

(10) Patent No.: US 8,037,388 B2
(45) Date of Patent: Oct. 11, 2011

(54) METHOD AND DEVICE FOR LAYERED DECODING OF A SUCCESSION OF BLOCKS ENCODED WITH AN LDPC CODE

(75) Inventors: Vincent Heinrich, La Tronche (FR); Laurent Paumier, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 1106 days.

(21) Appl. No.: 11/830,444

(22) Filed: Jul. 30, 2007

(65) Prior Publication Data
US 2008/0049869 A1 Feb. 28, 2008

(30) Foreign Application Priority Data
Aug. 24, 2006 (FR) .................................... 06 07490

(51) Int. Cl.
*H03M 13/00* (2006.01)
(52) U.S. Cl. ......................... 714/752; 714/763; 714/792
(58) Field of Classification Search .................. 714/752, 714/763, 800, 792, 801, 794, 758
See application file for complete search history.

(56) References Cited

U.S. PATENT DOCUMENTS

| 7,260,762 | B2 | 8/2007 | Desai et al. ................. 714/755 |
|---|---|---|---|
| 7,484,158 | B2 | 1/2009 | Sharon et al. ............... 714/755 |
| 7,577,892 | B1 | 8/2009 | He ............................... 714/755 |
| 7,590,929 | B2 * | 9/2009 | Morita et al. ................ 714/800 |
| 7,669,106 | B1 * | 2/2010 | Farjadrad .................... 714/758 |
| 7,707,479 | B2 | 4/2010 | Niu et al. ..................... 714/758 |
| 7,770,090 | B1 | 8/2010 | Kons et al. ................... 714/780 |
| 2004/0255228 | A1 * | 12/2004 | Shen et al. ................... 714/792 |
| 2005/0138519 | A1 | 6/2005 | Boutillon et al. ............. 714/752 |
| 2005/0229087 | A1 | 10/2005 | Kim et al. .................... 714/800 |
| 2006/0005104 | A1 * | 1/2006 | Harada ........................ 714/758 |
| 2006/0036923 | A1 | 2/2006 | Hedberg et al. ............. 714/752 |
| 2006/0085720 | A1 * | 4/2006 | Tran et al. .................... 714/758 |
| 2006/0107181 | A1 | 5/2006 | Dave et al. ................... 714/758 |

FOREIGN PATENT DOCUMENTS
WO 2006/020934 2/2006

OTHER PUBLICATIONS

"Pipelined clock-Serial Decoder Architecture for Structured Ldpc Codes", Bhatt et al., ICASSP 2006, Proceedings of the International Conference on Acoustics, Speech and Signal Processing, Toulouse, France May 14-19, 2006, Piscataway, NJ, USA, IEEE, pp. IV-225-IV-228, XP010931023, ISBN: 1-4244-0469-X.

* cited by examiner

Primary Examiner — Fritz Alphonse
(74) Attorney, Agent, or Firm — Lisa K. Jorgenson; Allen, Dyer, Doppelt, Milbrath & Gilchrist, P.A.

(57) ABSTRACT

The metrics matrix may include at least one particular layer including at least one particular column having several metrics cues, respectively, situated in different rows. For the particular layer, the updating of the channel cue is associated with the particular column involving at each iteration one updated metric cue selected from all the metrics cues of the particular column. The row of the selected metric cues may change at each iteration.

20 Claims, 8 Drawing Sheets

FIG.6

$$D = \begin{pmatrix} 1 & & & & & (0) \\ & 1 & & & & \\ & & 1 & & & \\ & & & 1 & & \\ (0) & & & & 1 & \\ & & & & & 1 \\ 1 & & & & & \end{pmatrix} \qquad D = \begin{pmatrix} & & & & 1 & (0) \\ & & & 1 & & \\ & & & & & 1 \\ 1 & & (0) & & & \\ & 1 & & & & \\ (0) & 1 & & & & \end{pmatrix}$$

FIG.7

$$H = \begin{bmatrix}
0\ 1\ 0\ 0\ ...\ 0\ 1 & 0\ 0\ 1\ ...\ 0\ 0 & ... & 1\ 1\ 0\ ..............\ 0 \\
 & & & \phantom{xxxxxxxxxxxxxx} 1 \\
1\ 0\ 1\ 0\ ...\ 0\ 0 & 0\ 0\ 0\ ...\ 0\ 0 & ... & 0\ ...\ 0110..........0 \\
 & & & \phantom{xxxxxxxxxx} 1\ 0........0 \\
0\ 1\ 0\ 1\ ...\ 0\ 0 & 0\ 0\ 0\ ...\ 0\ 0 & ... & 0..............0110...0 \\
 & & & \phantom{xxxxxxxxxxxxx} 1\ 0...0 \\
0\ 0\ 1\ 0\ ...\ 0\ 0 & 0\ 0\ 0\ ...\ 1\ 0 & ... & \\
0\ 0\ 0\ 1\ ...\ 1\ 0 & 0\ 0\ 0\ ...\ 0\ 1 & ... & \\
0\ 0\ 0\ 0\ ...\ 0\ 1 & 1\ 0\ 0\ ...\ 0\ 0 & ... & \\
1\ 0\ 0\ 0\ ...\ 1\ 0 & 0\ 1\ 0\ ...\ 0\ 0 & ... & 0..............0110..0 \\
 & & & \phantom{xxxxxxxxxxxx} 1\ 0..
\end{bmatrix}$$

← 360 → | ← 360 → | | ← N − K →

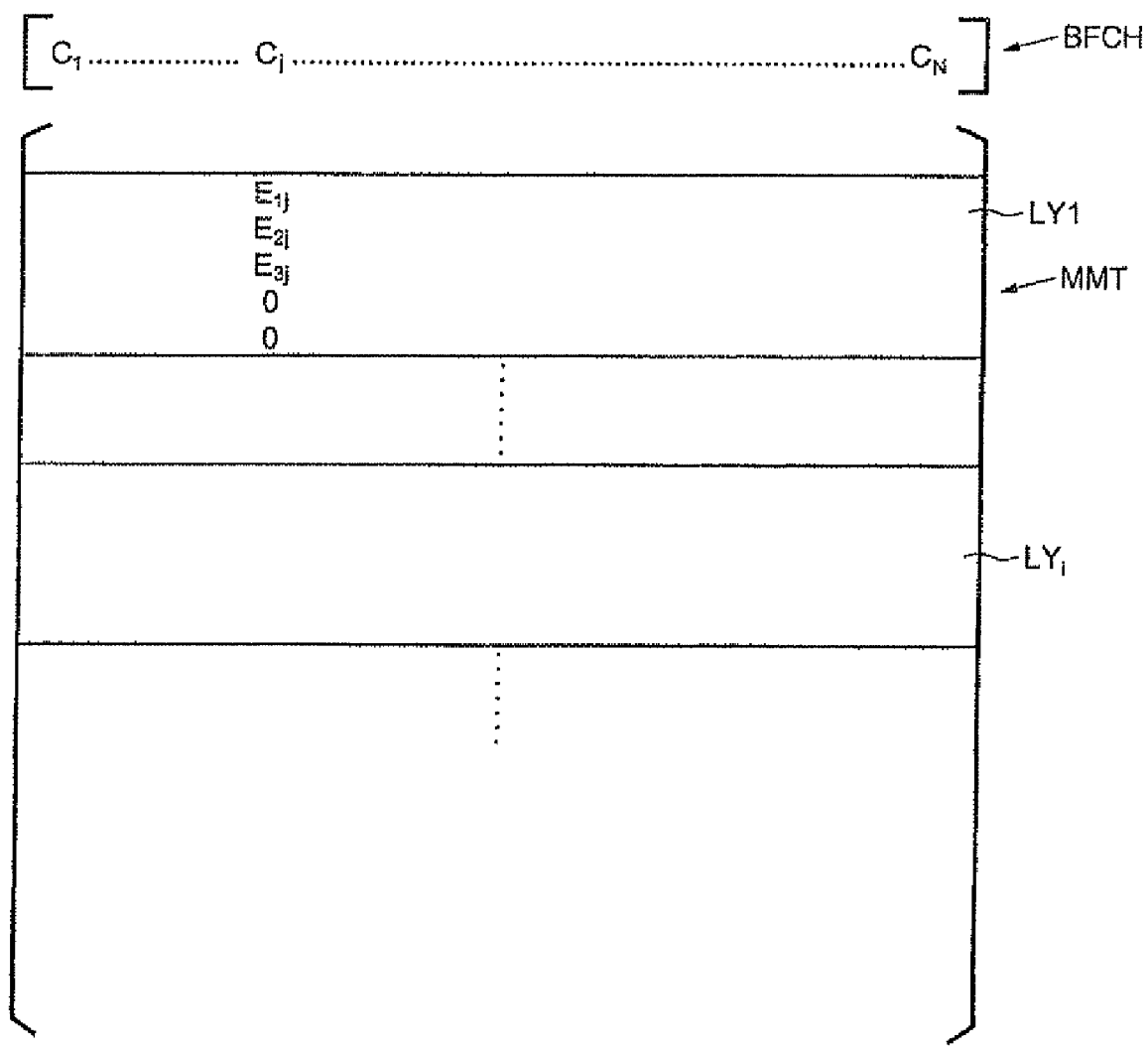

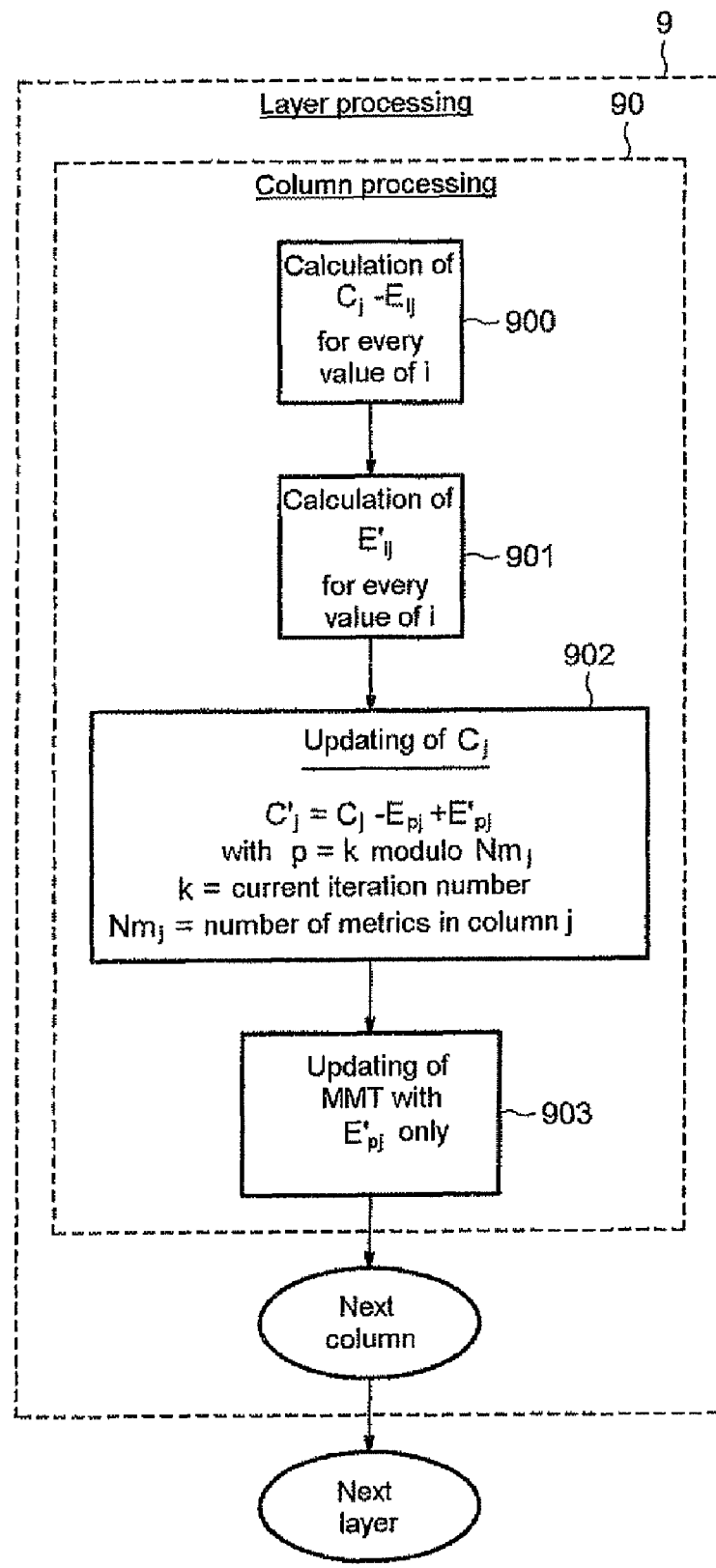

METHOD AND DEVICE FOR LAYERED DECODING OF A SUCCESSION OF BLOCKS ENCODED WITH AN LDPC CODE

CROSS REFERENCE TO RELATED APPLICATION

This application is a translation of and claims the priority benefit of French patent application number 0607490 filed on Aug. 24, 2006, entitled "METHOD AND DEVICE FOR LAYERED DECODING OF A SUCCESSION OF BLOCKS ENCODED WITH AN LDPC CODE", which is hereby incorporated by reference in its entirety.

FIELD OF THE INVENTION

The invention relates to the decoding of block-based codes such as, for example, the block-based codes whose parity matrix exhibits low density, that is to say comprises a low number of is. Such codes are better known by a person skilled in the art as Low Density Parity Check (LDPC) codes. The invention applies advantageously, but without limitation, to the LDPC codes used in the DVB-S2 standard, in particular for satellite transmissions.

BACKGROUND OF THE INVENTION

The LDPC code is a block-based code. The encoder processes blocks of K bits and delivers blocks of N bits. Thus, N-K redundancy bits are added. These N-K bits are called "parity bits". The coding rate or code rate is defined by the ratio K/N. The lower the coding rate, the higher the number of redundancy bits, and hence, the greater the protection against noise in a transmission channel.

These N-K bits are calculated with the help of a parity matrix H. Therefore, the LDPC code is also a code based on a matrix. This matrix has N-K rows and N columns and comprises "1s" and of "0s"$_1$, with a small number of "1s"; relative to the number of "0s". This is the reason why codes of this type, based on such a matrix, are called low-density codes (LDPC codes). The encoded block BLC, of N bits, is calculated by solving the equation $HBLC^T=0$, where H denotes the parity matrix and $^T$ the "transpose" function.

On the decoder side, the erroneous bits are corrected on the basis of the relationships between the coded cues of the block. These relationships are given by the parity matrix H. The decoder uses internal metrics corresponding to the "1s" of the matrix H. The matrix H corresponds to the Tanner graph of the LDPC code comprising so-called check nodes and bit nodes, interlinked by the path of the graphs that represent the messages exchanged iteratively between the nodes thus linked. These metrics are updated row-wise (updating of the check nodes) by taking account of the internal metrics of one and the same row. Thereafter, the decoder updates these metrics column-wise (updating of the bit nodes) by taking account of the internal metrics in one and the same column and also of the corresponding cue at the input of the decoder that originates from the transmission channel. An iteration corresponds to the updating of the check nodes for all the internal metrics, followed by the updating of the bit nodes for all the internal metrics.

The decoding of a block uses several iterations. The values of the decoded bits, also called "hard decisions", are obtained by adding together the internal metrics column-wise with the cues received and by taking the sign of the result. Stated otherwise, the sign of the result provides the value "0" or "1" of the bit while the absolute value of the result gives a confidence (probability) indication for this "0" or "1" logic value.

The LDPC-type codes are of interest since they make it possible to obtain very low bit error rates (BER) on account of the iterative nature of the decoding algorithm. Several iterative decoding algorithms exist for decoding LDPC codes, for example, a "belief propagation" (BP) classical algorithm as is well known to the person skilled in the art. That being the case, another algorithm, a "Layered Belief Propagation" algorithm or "Layered BP" is of particular interest because it uses fewer iterations than the classical BP algorithm for the same result.

More precisely, the matrix H is subdivided into layers, each formed of groups of rows. Whereas in the classical BP algorithm, the channel cues, initially equal to the cues of the received block to be decoded, are updated per column of the metrics matrix at the end of each iteration, these channel cues are, in the case of a layered decoding algorithm, updated layer by layer, and the cues updated for a current layer are used for the subsequent layer. Stated otherwise, in such a decoding algorithm of the "layered BP", type, the updating of the check nodes is performed on a layer, then the bit nodes are updated column-wise, then the check nodes are updated on the subsequent layer before the bit nodes are updated again column-wise, and so on, and so forth.

While the implementation of such an algorithm is relatively simple to achieve when each column of a layer comprises at most a single "1", the hardware embodiment becomes relatively complex and uses, in particular, multiplexers to perform operations several times on a previous result, when several "1s" are distributed within one and the same column of a layer. Specifically, the step of updating the check nodes will calculate, for the specific column, all the updated metrics that will thereafter be taken into account in updating the corresponding channel cue.

SUMMARY OF THE INVENTION

An object of the invention is to implement a decoding algorithm of the "layered" type that does not use a complex hardware implementation.

According to one aspect, there is proposed a method for decoding a succession of blocks encoded with an LDPC code and each comprising N cues. This method comprises successively decoding each block including an initialization of N channel cues with respectively the N cues of the block and of metrics cues distributed within a matrix comprising N columns and subdivided into layers, each comprising several rows. The method also comprises an iterative decoding processing including an updating, layer by layer, of the metrics cues distributed over the rows of a specific layer, and an updating of the channel cues respectively associated with the columns of the specific layer.

According to a general characteristic of this aspect, the metrics matrix comprises at least one particular layer having at least one particular column including several metrics cues, respectively situated in different rows. For the particular layer, the updating of the channel cue associated with the particular column involves, at each iteration, only one updated metric cue selected from all the metrics cues of the particular column, the row of the selected metric cue changing at each iteration. Stated otherwise, instead of updating the channel cue with all the values (metrics) of the column of the specific layer, it is updated only with one of these values, although the choice of this value varies from one iteration to another.

Thus, the hardware embodiment is simplified, and the routing constraints greatly reduced. Moreover, the inventors have observed that such an update involving only a single metric at each iteration leads to a reduction of the deterioration in the decoding performance. The metric cues are stored in a metrics memory, and the updating of the metrics cues distributed over the particular column of the particular layer advantageously comprises, at each iteration, a write to the metric memory of the sole updated metric cue selected for this iteration.

Although there are numerous ways of modifying the index number of the row of the metric cue selected at each iteration, a particularly simple way comprises in choosing as index number of the row of the metric cue selected at the current iteration, the value k modulo Nm, where k denotes the index number of the current iteration and Nm the number of metrics cues distributed over the particular column. In a particular, but not limiting application, the encoded blocks comply with the DVB-S2 standard.

According to another aspect, there is also proposed a decoder apparatus comprising an input for receiving a succession of blocks encoded with an LDPC code each comprising N cues. The decoder apparatus also comprises a channel memory suitable for storing N channel cues, a metrics memory suitable for storing metrics cues distributed within a matrix comprising N columns and subdivided into layers each comprising several rows, decoding means or a decoder suitable for successively decoding each block and comprising control means or a controller suitable for initializing the N channel cues with respectively the N cues of the block and the metrics cues, and for iteratively activating processing means or a processor suitable for performing an update, layer by layer, of the metrics cues distributed over the rows of a specific layer and an updating of the channel cues respectively associated with the columns of the specific layer.

According to a general characteristic of this other aspect, the metrics matrix comprises at least one particular layer including at least one particular column comprising several metrics cues respectively situated in different rows, and processing means or a processor being suitable, for the particular layer, for updating the channel cue associated with the column, while involving at each iteration only one updated metric cue selected from all the metrics cues of the column. The row of the selected metric cue changes at each iteration.

According to one embodiment, the processing means are suitable for updating the metrics cues distributed over the particular column of the particular layer by writing, at each iteration, to the metric memory, the sole updated metric cue selected for this iteration. According to another embodiment, the index number of the row of the metric cue selected at the current iteration is equal to k modulo Nm, where k denotes the index number of the current iteration and Nm the number of metrics cues distributed over the particular column.

According to yet another embodiment, the processing means comprise subtraction means or a subtractor connected to the output of the metrics memory and to the output of the channel memory, calculation means or a calculator connected to the output of the subtraction means and suitable for delivering the metrics cues updated with a latency T, and summation means or a summer connected to the output of the calculation means and the output of the subtraction means by way of a delay means or a buffer with delay equal to T, whose output is connected to the input of the channel memory. The output of the calculation means is connected to the input of the metrics memory.

The encoded blocks may comply with the DVB-S2 standard. According to another aspect, there is furthermore proposed a signal receiver complying with the DVB-S2 standard, incorporating a decoder as disclosed hereinabove.

BRIEF DESCRIPTION OF THE DRAWINGS

Other advantages and features of the present disclosure will become apparent on examining the detailed description of embodiments and modes of implementation, which are in no way limiting, and the appended drawings, in which:

FIGS. 6 and 7 illustrate an exemplary construction of a parity matrix in the case of the DVB-S2 standard according to the invention;

FIGS. 8 and 9 illustrate a mode of implementation of a method according to the invention;

DETAILED DESCRIPTION OF THE PREFERRED EMBODIMENTS

Embodiments and modes of implementation will now be described in greater detail in the case of a DVB-S2 application for which the length of the encoded blocks is 64,800 bits, although the embodiments disclosed are valid for all sizes of blocks.

Figure 1:
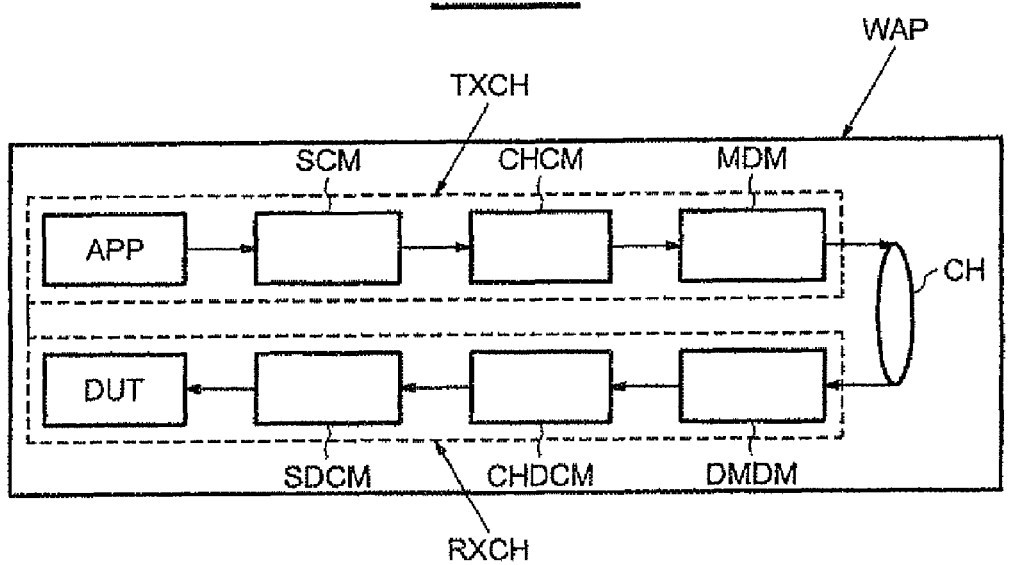
FIG. 1 schematically illustrates the internal structure of a wireless apparatus incorporating a decoder according to the invention.

In FIG. 1, the reference WAP denotes a wireless apparatus that may be used in a communication system complying with the DVB-S2 standard. The wireless apparatus WAP comprises a transmission chain TXCH capable of transmitting coded and modulated information over a transmission channel CH, for example, the air. Furthermore, this apparatus WAP also comprises a reception chain RXCH capable of receiving and decoding information originating from the transmission channel CH.

The transmission chain TXCH comprises, in a known manner, source coding means or a source coder SCM that receive application data APP so as, in particular, to compress them in order to reduce the data bit rate. The transmission chain also comprises channel coding means or a channel coder, whose function is, in particular, to add redundancy so as to be able to subsequently correct the potential reception errors due to the noise in the transmission channel. These channel coding means comprise, for example, LDPC coding means or a LDPC coder.

The transmission chain also comprises modulation means or a modulator MDM so as to adapt the signal to the transmission channel (satellite channel or radio channel, for example). The reception chain RXCH comprises similar means or circuits for performing the inverse functions. More precisely, there are demodulation means or a demodulator DMDM, followed by channel decoding means or a channel decoder CHDCM that comprise, for example, an LDPC decoder, followed by source decoding means or a source decoder SDCM delivering to the user the user data DUT corresponding to the application data APP.

Figure 2:
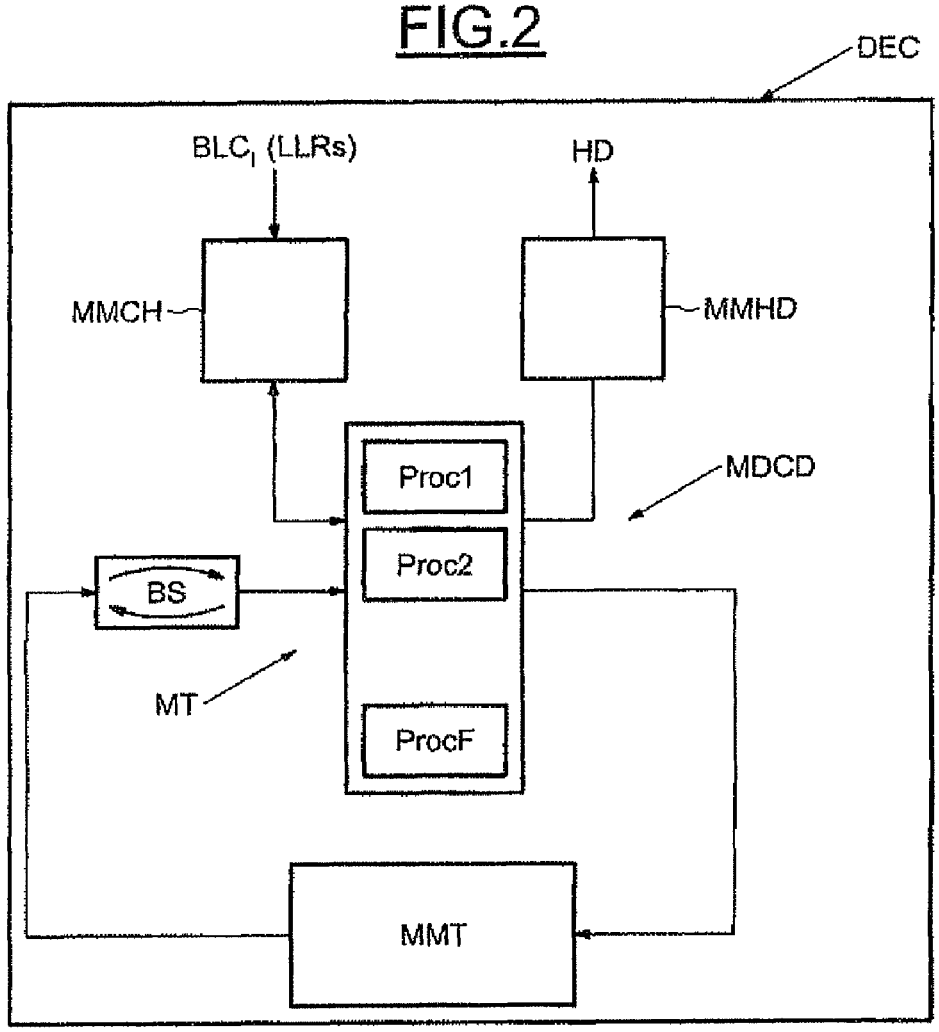
FIG. 2 illustrates in greater detail, but still schematically, an embodiment of an LDPC decoder according to the invention.

Referring more particularly now to FIG. 2, it may be seen that an exemplary LDPC decoder, referenced EC, schematically comprises input memory MMCH, decoding means or a decoder MDCD, and hand output memory MMHD. The input memory MMCH receives a succession of blocks $BLC_i$ encoded with an LDPC code. Each block comprises N coded cues, N being equal to 64,800 in the DVB-S2 standard, for example. These cues are probability ratios and are generally known to the person skilled in the art as Log Likelihood Ratio (LLR). These cues are coded on n bits. The sign of each cue is representative of its logic value while its absolute value is representative of the confidence that the logic value of this cue is correct.

Each received block $BLC_i$ is decoded in the decoding means MDCD comprising, in this example, F processors operating in parallel. The value F is equal to 360 in one application of the DVB-S2 standard, for example. The battery of F processors performs the updating of the check nodes and of the bit nodes. A metrics memory MMT contains the internal metrics (equal in number to the number of "1s" in the parity matrix). A mixing device, which is known by those skilled in the art (which is a shifting device in the case of an LDPC coding applied to the DVB-S2 standard), makes it possible to place the corresponding data opposite the corresponding processors. Finally, on completion of the decoding, the processors deliver, into the memory MMHD, the N hard decisions corresponding to the N decoded logic values of the block $BLC_i$.

Figure 3:
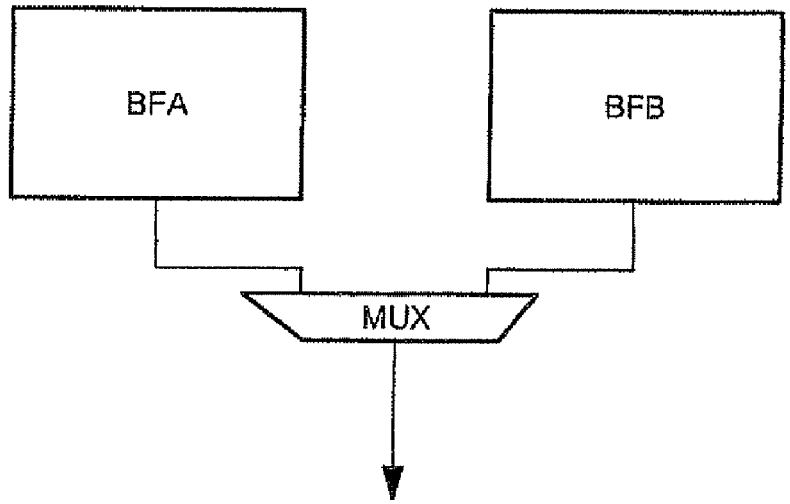
FIG. 3 schematically illustrates an exemplary embodiment of an input memory of an LDPC decoder according to the prior art.

In a prior-art approach illustrated in FIG. 3, the input memory comprises two buffer memories BFA, BFB, each capable of storing a block. The architecture of the decoding means and also the characteristics of the memory are chosen in such a way that the duration of decoding of an entire block is less than the duration for receiving and storing an entire block. In practice, these two durations are relatively similar. This is the reason why a time constraint analysis uses two buffer memories in which the blocks are stored alternately. One buffer memory is used for decoding a block while the subsequent block is stored in the other buffer memory, and vice versa.

Figure 4:
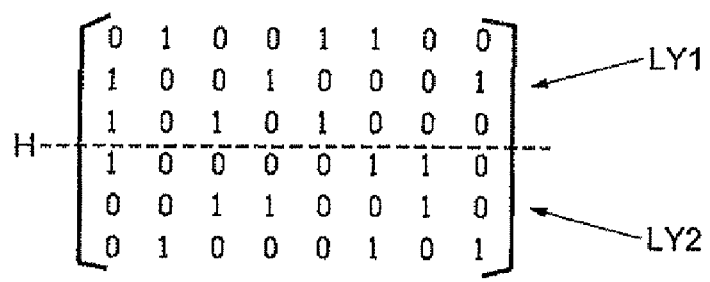
FIGS. 4 and 5 respectively illustrate exemplary parity and metrics matrices subdivided into layers, according to the invention.

FIG. 4 illustrates an exemplary parity matrix H of an LDPC code, this matrix H being subdivided here into two layers LY1 and LY2. To decode each block, the metrics memory MMT comprises metrics cues or metrics $E_{ij}$ corresponding to the "1s" of the matrix H. The metrics matrix MMT additionally comprises "0s" corresponding to the "0s" of the matrix H. For the decoding of a block, all the metrics cues $E_{ij}$ are set to zero (initialization).

Figure 5:
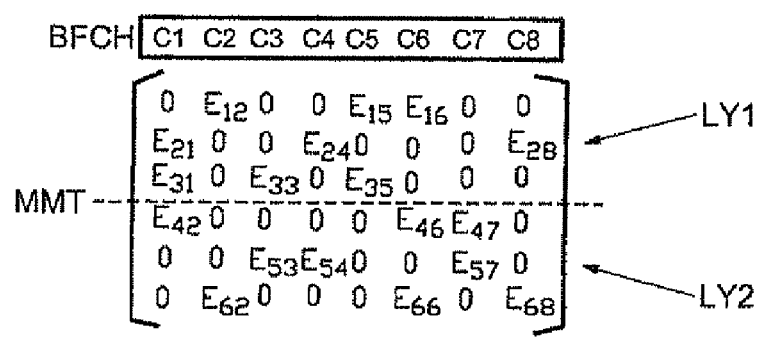

Additionally, the buffer memory BFCH, which is either the buffer memory BFA or the buffer memory BFB, stores, on initializing the decoding, the cues C1-C8 (LLR1-LLR8) of the specific block to be decoded. The metrics matrix MMT has a similar structure to parity matrix H, and therefore comprises, in this example illustrated in FIG. 5, two layers LY1 and LY2. The block will be decoded using a layered belief propagation algorithm.

More precisely, in a conventional layered BP-type algorithm, each iteration begins with the calculation of the check nodes, that is to say, the updating of the metrics cues for all the rows of a first layer of the matrix and for all the columns of this first layer. More precisely, if $E'_{ij}$ denotes an updated metric cue, this updated metric cue is given by the following formula:

$$E'_{ij}=g(C_k-E_{ik}) \text{ with } k \text{ belonging to } W_i \text{ and } k \neq j \quad (I)$$

in which $W_i$ denotes the whole set of positions of the "1s" in row i of the relevant layer and g denotes a conventional function used in updating the check nodes, this function may comprise a hyperbolic tangent function.

Next, the channel cues $C_j$ are updated for all the columns of the specific layer, using the following formula:

$$C'_j=C_j-E_{ij}+E'_{ij}$$

Once these operations have been performed, the next layer is then updated, and in this way, all the columns are processed in succession before going to the next iteration, where all the operations just described are repeated. After a determined number of iterations, the decoding is stopped and the hard decisions, that is to say, the logic values of the decoded bits of the block, are simply the signs of the channel cues $C_j$.

In practice, the LDPC codes that can be realized in terms of hardware are, for example, based on pseudo-random matrices. This implies that a parity matrix H comprises several regular sub-matrices. This offers parallelism in the calculation of the metrics cues. For example, the matrices used in the DVB-S2 standard have a parallelism of 360. The parity matrix H comprises matrices D that are interleaved, D being a diagonal matrix cyclically shifted by any value.

FIG. 6 illustrates examples of such matrices D while FIG. 7 illustrates an example of a parity matrix H that can be used in the DVB-S2 standard. Such a matrix H comprises two parts. The first part corresponds to the information bits and is formed with 360×360 sub-matrices. The other part corresponds to the redundancy bits and comprises an N-K×N-K square matrix with a double diagonal of "1s". All the rows of a sub-matrix are separated by q rows in the parity matrix H so that the matrix H has 360 q rows (or N-K rows).

To perform the decoding calculations, the data is read in groups of 360 so as to harness the matrix parallelism and reach the desired decoding speed. The application of a layered decoding algorithm to such matrices involves the parity matrix H being subdivided into a certain number of layers, the convergence of the decoding being faster as the number of layers increases.

One chooses to subdivide H into q layers of 360 rows each, this making it possible to have the largest possible number of layers while preserving the parallelism of 360. Also, each row of a layer is separated from the next row of the layer by q rows. Stated otherwise, the first layer comprises rows 1, q+1, 2q+1, and so forth, while the second layer comprises rows 2, q+2, 2q+2, and so forth.

It is noted in FIG. 7, the matrix H comprises, for a given layer, several "1s" in one and the same column. This may pose hardware complexity and wire routing problems for the implementation of conventional layered decoding algorithms. Specifically, assuming by way of example and for simplicity that a metric matrix MMT, such as that illustrated in FIG. 8, comprises three "1s" in column j of layer LY1. These three "1s" of the parity matrix are represented here by the metrics cues $E_{1j}$, $E_{2j}$ and $E_{3j}$, where $C_j$ denotes the corresponding channel cue.

In an implementation of a conventional layered decoding algorithm, the step of updating the check nodes comprises updating the metric cues $E'_{1j}$, $E'_{2j}$, and $E'_{3j}$. Next, the updating of the channel cues $C'_j$ is then performed according to the following formula:

$$C'_j=C_j-E_{1j}-E_{2j}-E_{3j}+E'_{1j}+E'_{2j}+E'_{3j}.$$

Stated otherwise, it uses three subtractions and three additions to update the channel cue $C_j$.

According to the mode of implementation of the method according to an embodiment, as illustrated in FIG. 9, when several metrics cues belong to the same column of a layer, the layered decoding algorithm is simplified. Specifically, instead of updating the channel cue with all the values of the metrics of the column, only a single one is used. On the other hand, the metric selected for the updating is changed at each iteration. This is explained in detail in the flow chart of FIG. 9.

More precisely, the processing of a layer 9 comprises a column processing 90, within which a calculation of $C_j - E_{ij}$ is firstly performed for every value of i (step 900). Next, a calculation of the new metrics cues $E'_{ij}$ is performed for every value of i (step 901) by applying the abovementioned formula (I).

Next, the channel cue $C_j$ is, in a step 902, updated using a single updated metric cue, namely in the present case, the metric cue $E'_{pj}$ where p is equal to k modulo $N_{mj}$ where k denotes the index number of the current iteration, and $N_{mj}$ denotes the number of metrics cues in column j. Stated otherwise, the updated channel cue $C'_j$ is equal to $C_j - E_{pj} + E'_{pj}$. Next, in step 903, the metrics matrix MMT is updated with the updated metric cue $E'_{pj}$. The method moves to the next column, and when the whole layer has been processed, the method moves to the next layer.

Returning now to the example of FIG. 8, in which there are three "1s" in column j, step 901 will provide the updated metrics cues $E'_{1j}$, $E'_{2j}$ and $E'_{3j}$. Assuming that the current iteration is iteration No. k, the new updated channel cue $C'_{jk}$ is then given by the following formula:

$$C'_{jk} = C_{jk} - E_{1jk} + E'_{jk}.$$

It is noted that during iteration k, the first metric cue is used for the updating of the channel cue.

At the next iteration k+1, the new channel cue $C'_{j(k+1)}$ is given by the following formula:

$$C'_{j(k+1)} = C_{j(k+1)} - E_{2j(k+1)} + E'_{2j(k+1)}$$

It is noted at this iteration that the second metric cue that is used.

Figure 10:
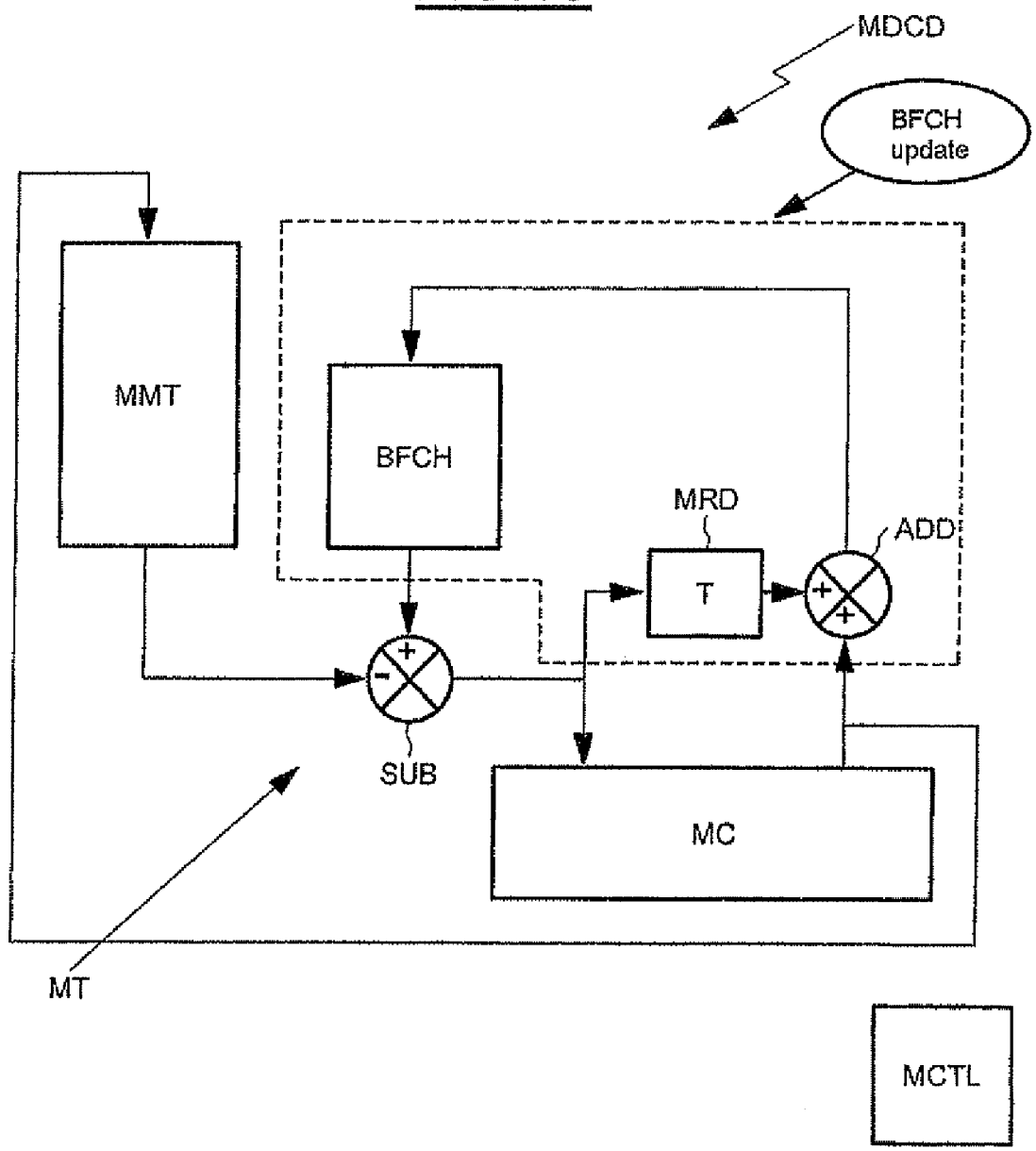
FIG. 10 illustrates in greater detail a hardware architecture of processing means or a processor according to the invention.

During the next iteration, it will be the third metric cue that will be used and then the first again, and so on and so forth. The hardware architecture of the decoding means or a decoder MDCD may be simplified, as illustrated in FIG. 10. The decoding means comprise processing means or a processor MT and control means or a controller MCTL, for example, ones that may be readily embodied with the help of logic circuits, suitable for activating them in such a way as to implement the decoding method, just described in the above embodiments.

The processing means or a processor MT may have a particularly simple architecture and comprise subtraction means or a subtractor SUB connected to the output of the metrics memory MMT and to the output of the channel memory BFCH. Additionally, calculation means or a calculator MC performs, in particular, the updating of the check nodes (metric cues) and provides the processors and also the shifting means or a shift register, which are connected to the output of the subtraction means SUB and deliver the metrics cues that have been updated with a latency T.

The processing means or a processor may comprise summation means or a summer ADD connected to the output of the calculation means and to the output of the subtraction means SUB by way of a delay means or a buffer MRD producing a delay equal to T. The output of the adder ADD is connected to the input of the channel memory. Additionally, the output of the calculation means MC is connected to the input of the metric memory MMT.

Figure 11:
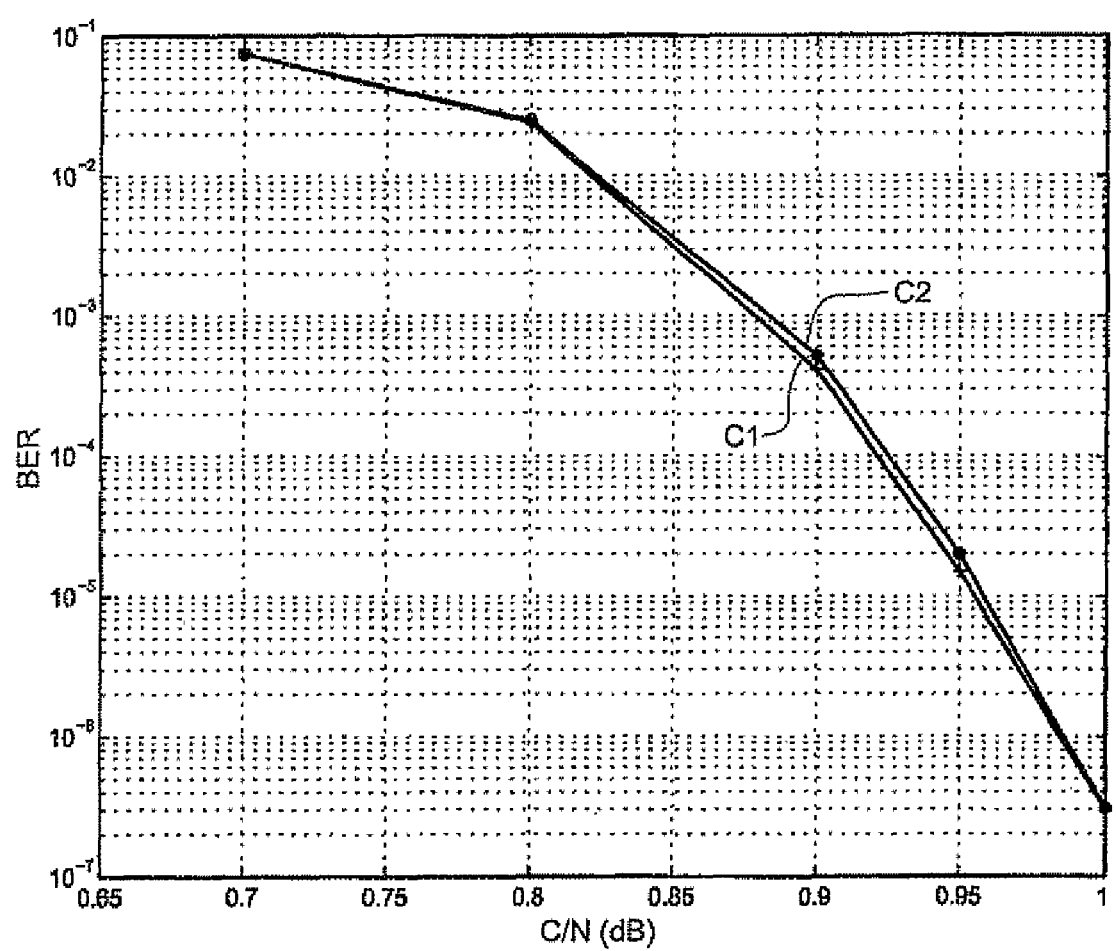
FIGS. 11 and 12 represent comparative plots of the bit error rate and the block error rate, respectively, as a function of signal-to-noise ration between the invention and the prior art, wherein curve C1 represents the prior art and curve C2 represents the invention.
Figure 12:
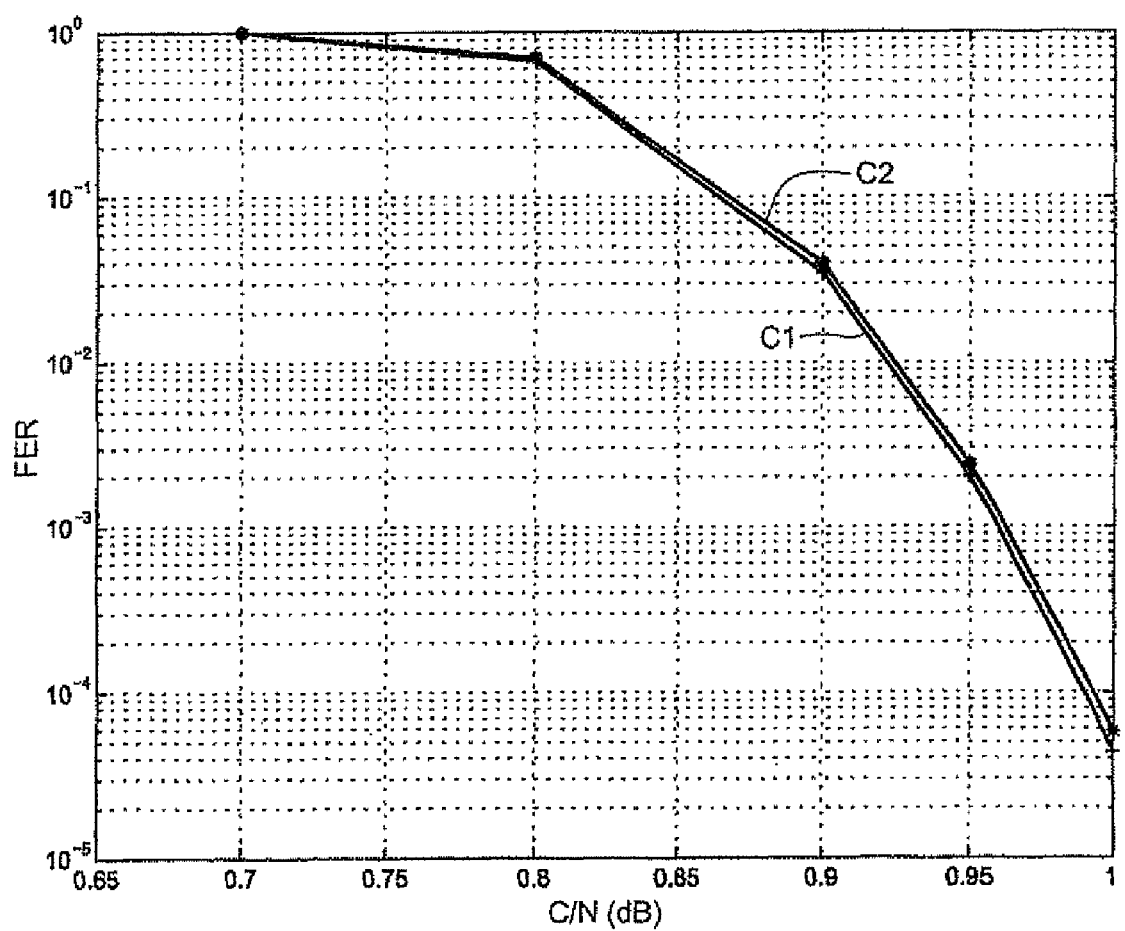

FIG. 11 illustrates the plot of the bit error rate (BER) as a function of the signal-to-noise ratio for parity matrices of the DVB-S2 type with block lengths (N) equal to 64,800 bits, QPSK modulation and a coding rate of 1/2. Curve C1 shows the plot of the BER rate for a conventional layered decoding algorithm while C2 shows the plot of the BER rate for decoding according to the embodiments disclosed herein. Curve C1 of FIG. 12 illustrates, under the same conditions, the block error rate FER for a decoding according to the prior art while curve C2 of FIG. 12 relates to the plot of the FER rate for decoding according to the embodiments disclosed herein. Hence, in both cases a reduction of the degradation in performance is obtained. Specifically, the maximum discrepancy between the two curves is around 0.005 dB.

These above described embodiments are not limited to the modes of implementation just described, but encompasses all variants thereof. More precisely, these embodiments are completely compatible with an input memory structure MMCH, such as that described in the French patent application filed in the name of the applicant on the same day as the present patent application and entitled "Procédé et dispositif de décodage de blocs encodés avec un code LDPC" [Method and device for decoding blocks encoded with an LDPC code], in which the input memory is capable of storing more than two blocks and comprises for example p+q elementary memories each capable of storing N/p cues (LLRs) and a transfer memory, the transfer memory playing the role here of the buffer memory BFCH.

That which is claimed:

1. A method for successively and individually decoding a plurality of blocks encoded with a Low Density Parity Check (LDPC) code, each block comprising a given number (N) of cues, the method comprising:

using a decoder for initializing N channel cues, respectively, with the N cues of the block and metrics cues distributed within a metrics matrix including N columns and subdivided into a plurality of layers, each layer comprising a plurality of rows; and using the decoder for decoding each block iteratively by at least updating, layer-by-layer, the metrics cues distributed over the N columns of the plurality of layers, and updating the N channel cues respectively associated with the N columns of each layer;

the metrics cues being situated in different rows for each layer;

the updating of the N channel cues respectively associated with the N columns involving, at each iteration, a single updated metric cue selected from the metrics cues of a current column for a current iteration, a respective row of the selected single updated metric cue changing at each iteration.

2. The method according to claim 1 wherein the metrics cues are stored in a metrics memory; wherein the updating of the metrics cues distributed over the N columns of the plurality of layers comprises, at each iteration, a write to the metric memory of the selected single updated metric cue for the current iteration.

3. The method according to claim 1 wherein an index number of a respective row of the selected single updated metric cue at the current iteration is equal to k modulo Nm, where k denotes the index number of the current iteration, and Nm denotes the number of metrics cues distributed over the N columns.

4. The method according to claim 1 wherein the encoded blocks comply with a digital video broadcasting satellite—second generation (DVB-S2) standard.

5. A method for successively and individually decoding a plurality of blocks encoded with a Low Density Parity Check (LDPC) code, each block comprising a given number (N) of cues, the method comprising:
   using a decoder for initializing N channel cues, respectively, with the N cues of each block and metrics cues distributed within a metrics matrix including N columns and subdivided into a plurality of layers, each layer comprising a plurality of rows, the metrics cues being in different rows; and
   using the decoder for processing each layer in column-by-column manner to decode each block by at least updating respective metrics cues for each row, and
      updating a respective channel cue associated with a current column and the metrics matrix using a single updated metric cue selected from the metrics cues of the current column, a respective row of the selected single updated metric cue changing at each iteration.

6. The method according to claim 5 wherein the metrics cues are stored in a metrics memory; wherein the updating of the respective metrics cues distributed over the N columns of each layer comprises, at each iteration, a write to the metric memory of the selected single updated metric cue for a current iteration.

7. The method according to claim 5 wherein an index number of the respective row of the selected single updated metric cue selected at a current iteration is equal to k modulo Nm, where k denotes the index number of the current iteration, and Nm denotes the number of metrics cues distributed over the N columns.

8. The method according to claim 5 wherein the encoded blocks comply with a digital video broadcasting satellite—second generation (DVB-S2) standard.

9. A decoder apparatus comprising:
   an input configured to receive a succession of blocks encoded with a Low Density Parity Check (LDPC) code, each block comprising a given number (N) of cues;
   a channel memory configured to store N channel cues;
   a metrics memory configured to store metrics cues distributed within a metrics matrix comprising N columns and subdivided into a plurality of layers, each comprising a plurality of rows, the metrics cues being in different rows; and
   a decoder configured to successively decode each block and comprising a processor, and a controller configured to initialize the N channel cues respectively with the N cues of each block and the metrics cues, and iteratively activate said processor for
      performing an update, layer-by-layer, of the metrics cues distributed over the plurality of rows of a current layer, and
      performing an update of the N channel cues respectively associated with the N columns of each layer, and
      said processor configured to update a respective channel cue associated with a current column while involving at each iteration a single updated metric cue selected from the metrics cues of the current column, a row of the single selected update metric cue changing at each iteration.

10. The decoder apparatus according to claim 9 wherein said processor is configured to update the metrics cues distributed over the plurality of rows of a respective layer by at least writing, at each iteration, to said metric memory, the selected single updated metric cue for a current iteration.

11. The decoder apparatus according to claim 9 wherein an index number of a respective row of the selected single updated metric cue at a current iteration is equal to k modulo Nm, where k denotes the index number of the current iteration, and Nm denotes the number of metrics cues distributed over the current column.

12. The decoder apparatus according to claim 9 wherein said processor comprises a subtractor configured to be coupled to an output of said metrics memory and to an output of said channel memory; and further comprising:
   a calculator configured to be coupled to an output of said subtractor and deliver the metrics cues updated with a latency T; and
   an adder configured to be coupled to an output of said calculator and to the output of said subtractor by way of at least a buffer producing a delay equal to T, an output of the buffer being coupled to an input of said channel memory, the output of said calculator being coupled to an input of said metrics memory.

13. The decoder apparatus according to claim 9 wherein the encoded blocks comply with a digital video broadcasting satellite—second generation (DVB-S2) standard.

14. A decoder apparatus for decoding a succession of blocks encoded with a Low Density Parity Check (LDPC) code, each block comprising a given number (N) of cues, and comprising:
   a channel memory configured to store N channel cues;
   a metrics memory configured to store metrics cues distributed within a metrics matrix comprising N columns and subdivided into a plurality of layers, each comprising a plurality of rows; and
   a decoder configured to successively decode each block and comprising a processor, and a controller configured to initialize the N channel cues respectively with the N cues of each block and the metrics cues, and iteratively activate said processor for processing each layer in column-by-column manner to decode each block by at least updating respective metrics cues for each row, and
      updating a respective channel cue associated with a current column and the metrics matrix using a single updated metric cue selected from the metrics cues of the current column, a respective row of the selected single updated metric cue changing at each iteration.

15. The decoder apparatus according to claim 14 wherein said processor is configured to update the metrics cues distributed over the plurality of rows of a respective layer by at least writing, at each iteration, to said metric memory, the selected single updated metric cue for a current iteration.

16. The decoder apparatus according to claim 14 wherein an index number of a respective row of the selected single updated metric cue at a current iteration is equal to k modulo Nm, where k denotes the index number of the current iteration, and Nm denotes the number of metrics cues distributed over the current column.

17. The decoder apparatus according to claim 14 wherein said processor comprises a subtractor configured to be coupled to an output of said metrics memory and to an output of said channel memory; and further comprising:
   a calculator configured to be coupled to an output of said subtractor and deliver the metrics cues updated with a latency T; and
   an adder configured to be coupled to an output of said calculator and to the output of said subtractor by way of at least a buffer producing a delay equal to T, an output of the buffer being coupled to an input of said channel memory, the output of said calculator being coupled to an input of said metrics memory.

18. A signal receiver complying with a digital video broadcasting satellite—second generation (DVB-S2) standard and including a decoder for decoding a succession of blocks encoded with a Low Density Parity Check (LDPC) code, each block comprising a given number (N) of cues, the decoder comprising:

a channel memory configured to store N channel cues;

a metrics memory configured to store metrics cues distributed within a metrics matrix comprising N columns and subdivided into a plurality of layers, each comprising a plurality of rows; and a decoder configured to successively decode each block and comprising a processor, and a controller configured to initialize the N channel cues respectively with the N cues of each block and the metrics cues, and iteratively activate said processor for processing each layer in column-by-column manner to decode each block by at least updating respective metrics cues for each row, and updating a respective channel cue associated with a current column and the metrics matrix using a single updated metric cue selected from the metrics cues of the current column, a respective row of the selected single updated metric cue changing at each iteration.

19. The signal receiver according to claim 18 wherein said processor is configured to update the metrics cues distributed over the plurality of rows of a respective layer by at least writing, at each iteration, to said metric memory, the selected single updated metric cue for a current iteration.

20. The signal receiver according to claim 18 wherein an index number of a respective row of the selected single updated metric cue at a current iteration is equal to k modulo Nm, where k denotes the index number of the current iteration, and Nm denotes the number of metrics cues distributed over the current column.

\* \* \* \* \*

UNITED STATES PATENT AND TRADEMARK OFFICE
CERTIFICATE OF CORRECTION

| | | |
|---|---|---|
| PATENT NO. | : 8,037,388 B2 | Page 1 of 1 |
| APPLICATION NO. | : 11/830444 | |
| DATED | : October 11, 2011 | |
| INVENTOR(S) | : Heinrich et al. | |

It is certified that error appears in the above-identified patent and that said Letters Patent is hereby corrected as shown below:

In the Drawings    Delete: FIG. 3

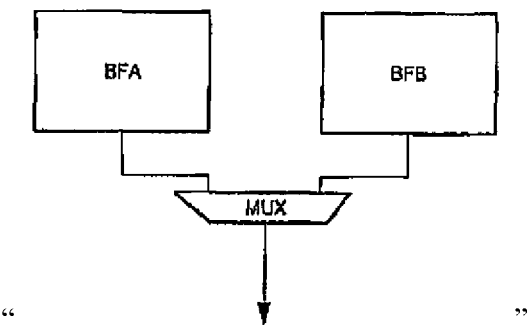

Insert: FIG. 3

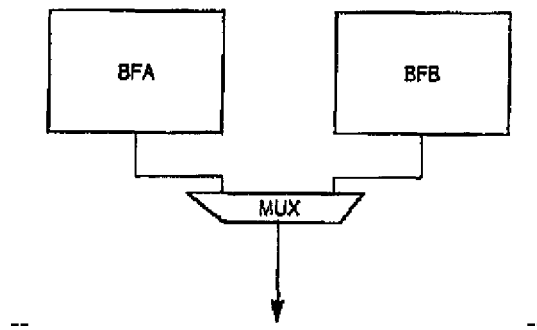

Column 1, Line 21    Delete: "number of is"
Insert: --number of 1s.--

Signed and Sealed this
Second Day of October, 2012

David J. Kappos
*Director of the United States Patent and Trademark Office*